United States Patent
Park et al.

(10) Patent No.: US 6,258,726 B1
(45) Date of Patent: Jul. 10, 2001

(54) METHOD OF FORMING ISOLATION FILM FOR SEMICONDUCTOR DEVICES

(75) Inventors: Tai-Su Park, Kyungki-do; Yu-gyun Shin, Seoul; Han-sin Lee; Kyung-won Park, both of Kyungki-do, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/412,888

(22) Filed: Oct. 5, 1999

(30) Foreign Application Priority Data

Oct. 20, 1998 (KR) .................................................. 98-43840

(51) Int. Cl.[7] .................................................. H01L 21/302
(52) U.S. Cl. ........................... 438/712; 438/723; 438/724
(58) Field of Search ..................................... 438/425, 437, 438/692, 712, 700, 702, 723, 724, 745, 756, 757

(56) References Cited

U.S. PATENT DOCUMENTS 5,854,121 * 12/1998 Gardner et al. ...................... 438/425
5,949,126 * 9/1999 Dawson et al. ...................... 257/513
6,008,109 * 12/1999 Fulford, Jr. et al. ................. 438/437

* cited by examiner

Primary Examiner—Benjamin L. Utech
Assistant Examiner—Binh X. Tran
(74) Attorney, Agent, or Firm—Skjerven Morrill MacPherson LLP; David W. Heid

(57) ABSTRACT

A method of forming an isolation film forms a spacer for connecting the edge of an active region to the isolation film. The spacer is on the upper sidewall of a trench and smoothes the transition or step between the level of the isolation film and the level of the active region. Accordingly, a gate oxide film of a uniform thickness can be formed on the entire active region in a subsequent process, thus preventing degradation of the characteristics of the gate oxide film. The spacer can be formed using a sidewall spacer on the hard mask used for forming the trench. The sidewall spacer protects part of the isolation formed in the trench, and etching after removal of the sidewall spacer can round the protected portion to create the spacer. Furthermore, to dispel stresses and defects in the isolation film, annealing for densification of the isolation film can be performed at a high temperature such as about 1150° C. because the spacer mitigates the effects of shrinking or sagging of the isolation film.

12 Claims, 2 Drawing Sheets

METHOD OF FORMING ISOLATION FILM FOR SEMICONDUCTOR DEVICES

BACKGROUND OF THE INVENTION

1. Field of the Invention

The present invention relates to a method for manufacturing a semiconductor device, and more particularly, to a method of forming an isolation film for semiconductor devices.

2. Description of the Related Art

A typical process for forming a trench-type isolation film in an integrated circuit includes using a mask layer pattern to protect an active region of a semiconductor substrate, forming a trench in a field region of the semiconductor substrate, filling the trench with a dielectric film, flattening the dielectric film, and removing the mask layer pattern. The shape of the isolation film and a step between the isolation film and the active region can affect the characteristics of a gate oxide film formed subsequently. For example, a gate oxide film is typically thinner at a side wall of the trench, that is at the transition between the isolation film and the active region. A voltage applied across the gate oxide film induces charge and electric fields that are greatest where the gate oxide film is thinnest. As a result, the insulating characteristics of the thinnest regions of the gate oxide film can be degraded.

Another factor that affects the characteristics of the gate oxide film is an annealing that increases the isolation film's resistance against a wet etching. For example, when the isolation film is annealed at 1050° C., the wet etching resistance of the isolation film increases. However, the annealing can generate defects such as dislocations in the isolation film. The dislocations can degrade the characteristics of the overlying gate oxide film. In contrast, annealing the isolation film at a higher temperature, for example, 1150° C., avoids defects such as dislocations in the isolation film but may partially thin the gate oxide film.

SUMMARY OF THE INVENTION

To solve the above problems, a method of forming an isolation film for semiconductor devices improves the characteristics of a gate oxide film to be formed later by removing defects in an isolation film and improving the shape of the isolation film filling a trench. In particular, a spacer in the isolation film at the edge of the trench smoothes the transition from the isolation film to the active region and allows formation of a uniform gate oxide film.

In accordance with one embodiment of the present invention, a method of forming an isolation film starts by setting an active region and a field region in a substrate. A mask layer pattern, including first and second mask layer patterns, covers the active region and exposes the field region to permit formation of a trench in the field region. A first insulating film, which fills the trench, is formed on the mask layer pattern and is densified. Etching back the first insulating film to expose the sidewalls of the second mask layer pattern forms a first isolation film. A first spacer is then formed on the sidewall of the mask layer pattern, and the first isolation film is anisotropically etched until the altitude or level of the first isolation film is lower than that of the active region of the substrate. The second mask layer pattern and the first spacer are removed. The first mask layer pattern is removed, leaving a second isolation film with a second spacer that makes an acute angle with the sidewall of the trench on the upper sidewall of the trench.

In an exemplary embodiment, the first and second mask layer patterns are respectively a pad oxide film pattern and a nitride film pattern, and the isolation film is an undoped silicate glass. Annealing at a predetermined temperature, e.g., 1150° C., can densify the isolation film. The first spacer is a nitride film, a high temperature oxide (HTO) film or a Plasma Enhanced-TetraEthoxyOrthoSilicate (PE-TEOS) film.

The etch-back of the first insulating film includes: etching the first insulating film until the surface of the mask layer pattern is exposed; and wet etching the first isolation film until the first isolation film is level with the first mask layer pattern.

The formation of the first spacer includes: forming a second insulating film on the first isolation film and the entire surface of the second mask layer pattern; and anisotropically etching the second insulating film until the first isolation film and the second mask layer pattern are exposed. The entire surface of the second insulating film can be anisotropically etched using plasma to leave the second spacer as a sidewall spacer on the second mask layer. According to one embodiment of the present invention, forming the second spacer and anisotropically etching the first isolation film are simultaneous.

In the isolation film formation, an isolation film having a portion contacting the upper end of a trench at an acute angle allows formation of a gate oxide film with a uniform thickness over the entire region. As a result, degradation of the characteristics of the gate oxide film, e.g., the breakdown voltage characteristics, can be prevented, and stresses in the isolation film can be dispelled.

BRIEF DESCRIPTION OF THE DRAWINGS

The features and advantages of the present invention will become apparent by describing embodiments thereof with reference to the attached drawings in which.

Use of same reference symbols in different figures indicates similar or identical items.

DESCRIPTION OF THE PREFERRED EMBODIMENT

Figure 1:
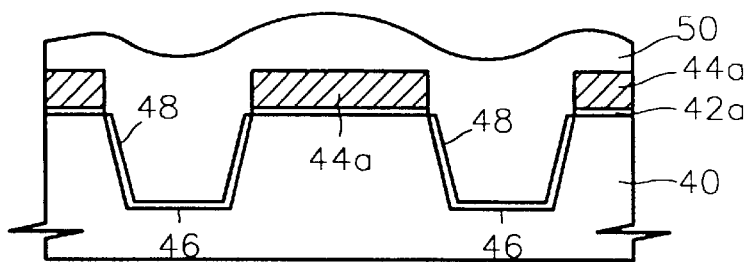
FIGS. 1 through 8 are cross-sectional views of intermediate semiconductor structures illustrating a method of forming an isolation film according to an embodiment of the present invention.

Hereinafter, embodiments of the present invention are described with reference to the attached drawings. However, the embodiments of the present invention can be modified into various other forms, and the scope of the present invention must not be interpreted as being restricted solely to the described embodiments. In the drawings, the thicknesses of layers or regions are exaggerated for clarity. Also, when a layer is described as formed "on" another layer or a substrate, the layer can be formed directly on the other layer or the substrate, or intermediate layers can intervene therebetween.

FIG. 1 shows a structure including first and second mask layer patterns 42a and 44a on a semiconductor substrate 40 having an active region and a field region. In an exemplary embodiment, the first mask layer pattern 42a is a pad oxide film, and the second mask layer pattern 44a is a silicon nitride film that is between 1500 Å and 2000 Å thick. To form the first and second mask layer patterns 42a and 44a, a photosensitive film (not shown), e.g., a photoresist film, is coated and patterned on stacked nitride and pad oxide films formed on the entire surface of the substrate 40. The photosensitive film pattern covers a region of the nitride film corresponding to the active region of the substrate 40. The nitride film and pad oxide film are anisotropically etched using the photosensitive film pattern as an etch mask, until the substrate 40 is exposed. Then, the photosensitive film pattern is removed, leaving a hard mask including the first and second mask layer patterns 42a and 44a.

After patterning the first and second mask layer patterns 42a and 44a as described above, the exposed region, i.e., the field region, of the substrate 40 is etched using the first and second mask layer patterns 42a and 44a as an etch mask for forming a trench 46. Then, a thermal oxide film 48 having a thickness of about 300 Å is formed on the sidewalls and bottom of trench 46, and a first insulating film 50 filling the trench is formed on the substrate 40. The first insulating film 50 is a chemical vapor deposition (CVD) oxide film. The CVD oxide is an undoped silicate glass (USG) film. The first insulating film 50 has a top surface according to the contours of the underlying structures. To densify the first insulating film 50 and make the first insulating film 50 resistant to a wet etching, the substrate 40, including the first insulating film 50, can be annealed under a nitrogen ($N_2$) atmosphere at about 1150° C. for one hour.

Figure 2:
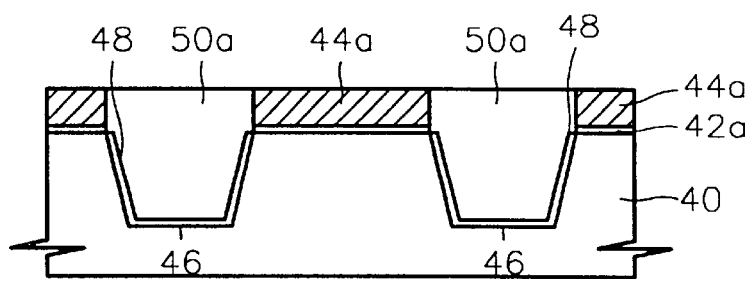

Referring to FIG. 2, after the annealing, a chemical mechanical polishing (CMP) process flattens the first insulating film 50. The chemical mechanical polishing proceeds until the second mask layer pattern 44a is exposed. The remaining insulating material in trench 46 is referred to as a first isolation film 50a. The CMP process also thins the second mask layer pattern 44a to about 500 Å to 1,200 Å.

Figure 3:
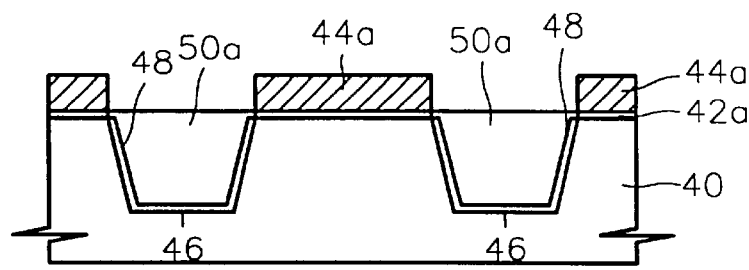

Referring to FIG. 3, the structure of FIG. 2 is wet etched with an etching solution such as a hydrogen fluoride (HF) solution. The wet etching continues until the sidewalls of the second mask layer pattern 44a, i.e., the nitride film pattern, are exposed. The wet etching thins the first isolation film 50a by the thickness of the second mask layer pattern 44a such that the level of the first isolation film 50a becomes equal to that of the first mask layer pattern 42a.

With reference to FIGS. 2 and 3, instead of the CMP and the wet etching, an anisotropic etching can form the first isolation film 50a by etching back the entire surface of the first insulating film 50, and exposing the sidewalls of the second mask layer pattern 44a.

Figure 4:
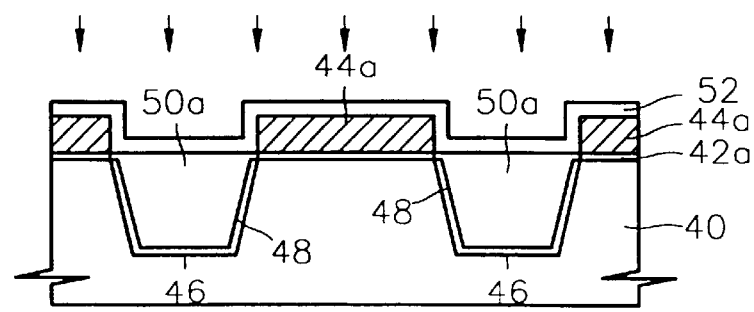
Figure 5:
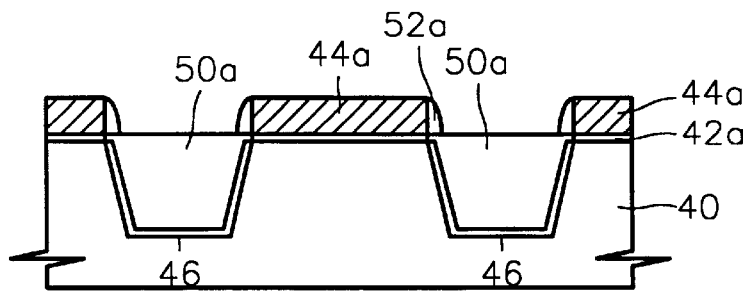

Referring to FIGS. 4 and 5, after exposing the sidewalls of the second mask layer pattern 44a, a second insulating film 52 is formed on the structure of FIG. 3. The second insulating film 52 is preferably a nitride film, but can be a CVD oxide film, e.g., an HTO film or a PE-TEOS film. The entire surface of the second insulating film 52 is anisotropically etched until the first isolation film 50a is exposed. As a result, a first spacer 52a is formed on the sidewall of the second mask layer pattern 44a. The first spacer 52a contacts the first isolation film 50a and the second mask layer pattern 44a. A plasma etching process can form the first spacer 52a.

Figure 6:
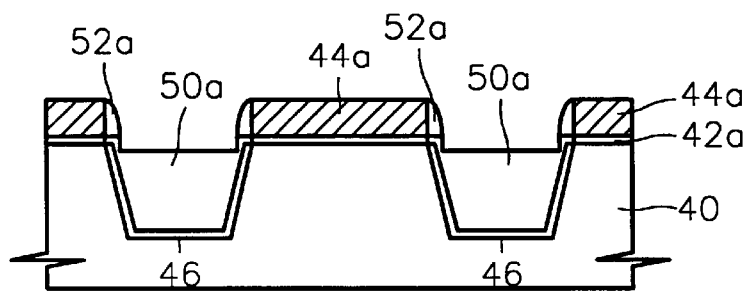

Referring to FIG. 6, the first isolation film 50a exposed as described above is further anisotropically etched for a predetermined time using the second mask layer pattern 44a and the first spacer 52a as an etch mask. It is preferable that the anisotropic etching continues until the first isolation film 50a is lower than the level of the first mask layer pattern 42a. Thus, the altitude of the first isolation film 50a is lower than that of the first mask layer pattern 42a. The formation of the first spacer 52a and further etching of the first isolation film 50a of FIGS. 5 and 6 can be performed in a single process, when an etch ratio difference between the first isolation film 50a and the first spacer 52a is small. For example, when the first isolation film 50a is an oxide film, and the first spacer 52a is a nitride film, the etch ratio difference between the first isolation film 50a and the first spacer 52a is small in the plasma anisotropic etching. Thus, a single plasma etching can form the first spacer 52a simultaneously with the first isolation film 50a, the level of which is lower than that of the semiconductor substrate 40.

Figure 7:
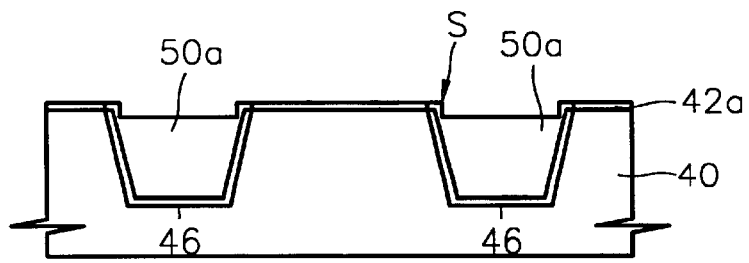

Referring to FIG. 7, after the further etching of the first isolation film 50a, a wet etching, for example, using $H_3PO_4$, removes the second mask layer pattern 44a and the first spacer 52a. As a result, the edge portions of the first isolation film 50a under the first spacer 52a and the first mask layer pattern 42a are exposed. The edge portion of the first isolation film 50a is at the same level as the first mask layer pattern 42a, and the remaining central portion of the first isolation film 50a is lower than the first mask layer pattern 42a. A stepped portion S remains on the surface of the first isolation film 50a at the transition to the active region.

Figure 8:
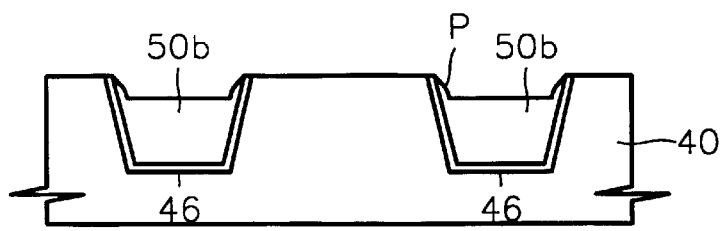

Referring to FIG. 8, a wet etching using HF removes the first mask layer pattern 42a. This process also rounds the stepped portion S of the first isolation film 50a, resulting in a second isolation film 50b having a second spacer P connecting the active region of the substrate to the second isolation film 50b. The second spacer P reduces the gradient between the active region and the first isolation film 50a. The second spacer P remains at the stepped portion S of the first isolation film 50a and serves as a bridge between the inner side of the second isolation film 50b and the edge of the active region of the substrate 40. The second spacer P makes an acute angle with the sidewall of trench 46, and smoothes the transition from the second isolation film 50b to the active region of the substrate 40. Then, a gate oxide film (not shown) can be formed to a uniform thickness on the active region of the substrate 40 in a subsequent process, because the round edge of the second isolation film 50b covers the steep edge of trench 46 with a smooth slope. The uniform thickness can help avoid degradation of the characteristics of the gate oxide film.

In summary, the present invention provides a method of forming an isolation film that promotes formation of a gate oxide film with a uniform thickness, and thus prevents a degradation of the characteristics of the gate oxide film. In addition, the method can include an annealing of the isolation film at about 1150° C. for removal of stress-induced defects in the isolation film.

Although the invention has been described with reference to a particular embodiment, the description is only an example of the inventions application and should not be taken as a limitation. Various adaptations and combinations of features of the embodiments disclosed are within the scope of the invention as defined by the following claims.

What is claimed is:

1. A method for forming an isolation film, comprising:
    (a) forming a mask including a first mask layer pattern and a second mask layer pattern on a semiconductor substrate, the second mask layer pattern being on the first mask layer pattern;
    (b) forming a trench in a portion of the substrate exposed by the mask;
    (c) forming a first insulating film which fills the trench and covers the mask;
    (d) etching the first insulating film until a sidewall of the second mask layer pattern is exposed, the remaining portion of the first insulating layer becoming a first isolation film;

(e) forming a first spacer on the sidewall of the second mask layer pattern, wherein step (e) comprises:
  (e1) forming a second insulating film on the substrate after step (d), so that the second insulating film covers the first isolation film and the second mask layer pattern; and
  (e2) anisotropically etching the second insulating film so that the first isolation film and the second mask layer pattern are exposed;
(f) etching the first isolation film until a top surface of the first isolation film is lower than that of the first mask layer pattern;
(g) removing the second mask layer pattern and the first spacer; and
(h) removing the first mask layer pattern and forming a second isolation film having a second spacer connecting an active region of the substrate to the second isolation film, on the upper sidewall of the trench, wherein the second spacer reduces the gradient between the active region and the first isolation film.

2. The method of claim 1, further comprising forming a thermal oxide film on an entire inner wall of the trench before step (c).

3. The method of claim 1, wherein the first and second mask layer patterns are respectively a pad oxide film pattern and a nitride film pattern.

4. The method of claim 1, wherein the first spacer is a nitride spacer.

5. The method of claim 1, wherein the first spacer is a chemical vapor deposition (CVD) oxide film spacer.

6. The method of claim 1, wherein the entire surface of the second insulating film is anisotropically etched using plasma.

7. The method of claim 1, wherein steps (e) and (f) are performed in a single etching process.

8. The method of claim 1, further comprising annealing the substrate after step (d) to densify the first insulating film.

9. The method of claim 1, wherein step (d) comprises:
  (d1) removing upper portions of the first insulating film until a top surface of the second mask layer pattern is exposed; and
  (d2) lowering the first isolation film to the same level as the first mask layer pattern.

10. The method of claim 9, wherein removing upper portions of the first insulating film comprises chemical mechanical polishing (CMP) of the first insulating film.

11. The method of claim 9, wherein step (d2) comprises wet etching the first isolation film until the first isolation film is level with the first mask layer pattern.

12. The method of claim 11, wherein the first isolation film is wet etched by a hydrogen fluoride (HF) solution.

* * * * *